United States Patent
Becker et al.

(10) Patent No.: US 9,638,750 B2
(45) Date of Patent: *May 2, 2017

(54) FREQUENCY-DOMAIN HIGH-SPEED BUS SIGNAL INTEGRITY COMPLIANCE MODEL

(71) Applicant: International Business Machines Corporation, Armonk, NY (US)

(72) Inventors: Wiren D. Becker, Hyde Park, NY (US); Daniel M. Dreps, Georgetown, TX (US); Jose A. Hejase, Austin, TX (US); Glen A. Wiedemeier, Austin, TX (US); Si T. Win, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 14/721,788

(22) Filed: May 26, 2015

(65) Prior Publication Data

US 2016/0349319 A1 Dec. 1, 2016

(51) Int. Cl.
*G01R 31/28* (2006.01)
*G01R 31/317* (2006.01)
*G01R 31/3177* (2006.01)
*G06F 13/42* (2006.01)

(52) U.S. Cl.
CPC ... *G01R 31/31703* (2013.01); *G01R 31/3177* (2013.01); *G06F 13/4282* (2013.01)

(58) Field of Classification Search
CPC .......... G01R 31/3177; G06F 13/4282
See application file for complete search history.

(56) References Cited

U.S. PATENT DOCUMENTS

| 6,785,625 B1 * | 8/2004 | Fan ........................ G01R 27/28 702/117 |
| 7,693,691 B1 | 4/2010 | Tao et al. |
| 7,720,654 B2 | 5/2010 | Hollis |
| 2007/0018637 A1 * | 1/2007 | Kim .................... G01R 31/3171 324/762.01 |
| 2007/0274378 A1 * | 11/2007 | Warke .................. H04B 17/26 375/225 |

(Continued)

OTHER PUBLICATIONS

Lawday et al., "A signal Integrity Engineer's Companion," Prentice Hall, New Your, 2008, pp. 23-24.

(Continued)

*Primary Examiner* — April Y Blair
*Assistant Examiner* — Thien D Nguyen
(74) *Attorney, Agent, or Firm* — Patterson + Sheridan, LLP (57) ABSTRACT

Embodiments of the present disclosure provide apparatus for using a compliance model to determine compatibility of a channel with a bus's chip I/O circuitry at its ends. The apparatus includes at least one processor and a memory coupled to the at least one processor. The processor is configured to: identify at least one design criteria; obtain boundary sets of frequency domain parameters for compliant signal channels known to achieve the design criteria; and verify whether a particular signal channel is compliant by comparing values of frequency domain parameters for the particular channel to one or more of the boundary sets of frequency domain parameters for the known compliant channels.

11 Claims, 9 Drawing Sheets

(56) References Cited

U.S. PATENT DOCUMENTS

| | | | | |
|---|---|---|---|---|
| 2010/0121595 | A1* | 5/2010 | Pupalaikis | H04L 43/50 |
| | | | | 702/67 |
| 2010/0329319 | A1* | 12/2010 | Dai | G01R 31/3171 |
| | | | | 375/224 |
| 2011/0238383 | A1* | 9/2011 | Metzger | G01R 27/04 |
| | | | | 702/196 |
| 2012/0294459 | A1* | 11/2012 | Chapman | G10H 3/186 |
| | | | | 381/98 |
| 2013/0173511 | A1 | 7/2013 | Cantin | |
| 2014/0152811 | A1* | 6/2014 | Kwon | H04B 17/309 |
| | | | | 348/135 |
| 2015/0213171 | A1* | 7/2015 | Gullapalli | G06F 17/5036 |
| | | | | 703/14 |

OTHER PUBLICATIONS

Ambasana et al., "Application of Artificial Neural Networks for Eye-Height/Width Prediction from S-Parameters," in Proc. IEEE Electrical Performance of Electronic Packaging and Systems Conf. (EPEPS), Portland, OR, Oct. 26-29, 2014, pp. 99-102.

PCI-SIG Community, "PCI Express Base Specification Revision 3.0," PCI-SIG, 2010, pp. 1-860.

International Business Machines, "Appendix P: List of IBM Patents or Patent Applications Treated As Related," May 26, 2015, 1 page.

* cited by examiner

| Index | ILF | ILD | ILDB | ILDA | SXTF | SXTB | SXTA |
|---|---|---|---|---|---|---|---|
| 1 | 18.7279 | 0.1486 | 0.3342 | 1.1832 | 18.2864 | 17.8515 | 9.4293 |
| 2 | 18.7575 | 0.1534 | 0.3416 | 1.2851 | 18.297 | 17.785 | 9.4366 |
| 3 | 18.8162 | 0.1734 | 0.3447 | 1.5371 | 18.2617 | 17.6215 | 9.4116 |
| 4 | 19.3377 | 0.1756 | 0.3951 | 1.6145 | 20.617 | 19.6423 | 10.879 |
| 5 | 19.3342 | 0.1531 | 0.4009 | 1.3897 | 20.2789 | 19.5641 | 10.8668 |
| 6 | 19.2484 | 0.1459 | 0.398 | 1.2791 | 20.2097 | 19.5172 | 10.8532 |
| 7 | 19.8904 | 0.2034 | 0.3866 | 1.8047 | 23.097 | 21.7639 | 12.2549 |
| 8 | 19.9269 | 0.1388 | 0.3995 | 1.3102 | 22.7369 | 21.7917 | 12.2638 |
| 9 | 19.8883 | 0.1463 | 0.4072 | 1.3718 | 22.7642 | 21.9337 | 12.265 |
| 10 | 19.7651 | 0.1841 | 0.4318 | 1.6796 | 22.7924 | 21.8782 | 12.1959 |
| 11 | 18.7344 | 0.1294 | 0.5998 | 1.0853 | 25.8381 | 24.7049 | 13.5546 |
| 12 | 20.0195 | 0.1739 | 0.3148 | 1.5016 | 25.86 | 24.5718 | 13.4428 |
| 13 | 20.7598 | 0.2744 | 0.823 | 2.223 | 25.9661 | 24.458 | 13.4721 |
| 14 | 20.2575 | 0.2088 | 0.5568 | 1.8198 | 25.8842 | 24.5625 | 13.4114 |
| 15 | 20.0577 | 0.2058 | 0.5392 | 1.748 | 25.9333 | 24.6062 | 13.4786 |
| 16 | 20.117 | 0.1734 | 0.3014 | 1.5796 | 25.9442 | 24.4994 | 13.4788 |
| 17 | 20.1094 | 0.1987 | 0.5566 | 1.7104 | 25.824 | 24.6504 | 13.4339 |
| 18 | 20.1707 | 0.1306 | 0.6969 | 1.0387 | 26.5372 | 24.4232 | 13.8154 |
| 19 | 20.0943 | 0.1267 | 0.5679 | 0.9927 | 26.4046 | 24.548 | 13.8387 |
| 20 | 20.1042 | 0.1367 | 0.5875 | 1.1933 | 26.4475 | 24.4317 | 13.749 |
| 21 | 20.4013 | 0.1672 | 0.3874 | 1.569 | 26.0647 | 24.4291 | 13.4327 |
| 22 | 20.195 | 0.1729 | 0.3765 | 1.5895 | 26.0245 | 24.622 | 13.5313 |
| 23 | 20.215 | 0.191 | 0.4709 | 1.7129 | 25.9531 | 24.5928 | 13.4693 |
| 24 | 20.1448 | 0.1872 | 0.4489 | 1.6557 | 25.9354 | 24.6124 | 13.456 |
| 25 | 20.3235 | 0.1738 | 0.2962 | 1.5748 | 25.9549 | 24.396 | 13.354 |
| 26 | 20.1242 | 0.1777 | 0.3577 | 1.5806 | 25.9188 | 24.5927 | 13.4528 |
| 27 | 19.507 | 0.143 | 0.6202 | 1.3176 | 30.5337 | 29.8265 | 14.2444 |
| 28 | 19.4972 | 0.1424 | 0.3755 | 1.1958 | 31.3858 | 29.225 | 14.1346 |
| 29 | 19.3857 | 0.1448 | 0.5908 | 1.3298 | 30.0584 | 29.7674 | 14.2419 |
| 30 | 19.5371 | 0.1734 | 0.4365 | 1.7023 | 30.578 | 29.1221 | 14.1094 |
| mean | 19.7816 | 0.16848 | 0.458137 | 1.485847 | 24.87959 | 23.66637 | 12.76524 |
| min | 18.7279 | 0.1267 | 0.2962 | 0.9927 | 18.2617 | 17.6215 | 9.4116 |
| max | 20.7598 | 0.2744 | 0.823 | 2.223 | 31.3858 | 29.8265 | 14.2444 |
| satisfy all | 18.7279 | 0.1267 | 0.2962 | 0.9927 | 31.3858 | 29.8265 | 14.2444 |

FIG. 8

| HEYE %UI | CTLE 1 | CTLE 2 | CTLE 3 | CTLE 4 | CTLE 5 | CTLE 6 | CTLE 7 | CTLE 8 |
|---|---|---|---|---|---|---|---|---|
| Preset 0 | 1.83 | 1.15 | 6.48 | 6.37 | 10.4 | 11.5 | 16.6 | 4.46 |
| Preset 1 | 0 | 0 | 0 | 0 | 0.08 | 6.65 | 9.91 | 0 |
| Preset 2 | 0 | 0 | 0 | 2.26 | 6.02 | 11.3 | 11.7 | 0 |
| Preset 3 | 0 | 0 | 0 | 0 | 0 | 1.52 | 5.44 | 0 |
| Preset 4 | 0 | 0 | 0 | 0 | 0 | 0 | 0 | 0 |
| Preset 5 | 0 | 0 | 0 | 0 | 0 | 1.63 | 3.71 | 0 |
| Preset 6 | 0 | 0 | 0 | 0 | 0 | 2.35 | 5.92 | 0 |
| Preset 7 | 12.7 | 12.7 | 17.1 | 17.8 | 19 | 22.6 | 24.8 | 14.7 |
| Preset 8 | 0.03 | 0.01 | 1.72 | 8.14 | 13.4 | 17.1 | 17.4 | 2.07 |
| Preset 9 | 0 | 0 | 0 | 0 | 0.37 | 1.84 | 5.22 | 0 |

| VEYE mVpp | CTLE 1 | CTLE 2 | CTLE 3 | CTLE 4 | CTLE 5 | CTLE 6 | CTLE 7 | CTLE 8 |
|---|---|---|---|---|---|---|---|---|
| Preset 0 | 4.14 | 3.78 | 11.88 | 15.28 | 25.6 | 30.2 | 45.8 | 9.56 |
| Preset 1 | 0 | 0 | 0 | 0 | 0.18 | 14.62 | 25 | 0 |
| Preset 2 | 0 | 0 | 0 | 5.04 | 12.08 | 25.6 | 31.2 | 0 |
| Preset 3 | 0 | 0 | 0 | 0 | 0 | 4.12 | 13.1 | 0 |
| Preset 4 | 0 | 0 | 0 | 0 | 0 | 0 | 0 | 0 |
| Preset 5 | 0 | 0 | 0 | 0 | 0 | 4.2 | 9.54 | 0 |
| Preset 6 | 0 | 0 | 0 | 0 | 0 | 5.88 | 15.46 | 0 |
| Preset 7 | 28.8 | 29.6 | 39.6 | 44.8 | 52.4 | 65.6 | 79.6 | 33.8 |
| Preset 8 | 0 | 0 | 5.14 | 19.42 | 32 | 43.2 | 49.6 | 5.28 |
| Preset 9 | 0 | 0 | 0 | 0 | 1.86 | 5.4 | 14.12 | 0 |

FIG. 9

FREQUENCY-DOMAIN HIGH-SPEED BUS SIGNAL INTEGRITY COMPLIANCE MODEL

BACKGROUND

Field of the Invention

Embodiments of the present disclosure relate to a communication bus, and more specifically, to determining bus channel compliance.

Description of Related Art

Computer server systems have many high-speed signal channels interconnecting the central processing units to a variety of input/output (I/O) chips which communicate with other computer systems, storage systems, network switches, and a large variety of peripherals. The physical implementation of the channel presents many design choices. Such choices include single-ended or differential wiring and the partitioning of components that may necessitate multiple printed circuit boards (PCBs) with connectors or even cables. Also, the manufacturing choices are many and include PCB materials, plated through hole (PTH) vias and stubs, trace cross-sections, the wire gauge of cables, connector design, component mounting and density of the traces needed to complete the design.

SUMMARY

Certain embodiments of the present disclosure generally provide a computer program product for channel compliance testing. The computer program product may include a computer readable storage medium having program instructions embodied therewith, the program instructions executable by a processor to cause the processor to identify at least one design criteria; obtain boundary sets of frequency domain parameters for compliant signal channels known to achieve the design criteria; and verify whether a particular signal channel is compliant by comparing values of frequency domain parameters for the particular channel to one or more of the boundary sets of frequency domain parameters for the known compliant channels.

Certain embodiments of the present disclosure generally provide a processing system. The processing system includes at least one processor configured to identify at least one design criteria; obtain boundary sets of frequency domain parameters for compliant signal channels known to achieve the design criteria; and verify whether a particular signal channel is compliant by comparing values of frequency domain parameters for the particular channel to one or more of the boundary sets of frequency domain parameters for the known compliant channels; and a memory coupled to the at least one processor.

DETAILED DESCRIPTION

There are a large number of channel design and manufacturing choices for development of high-speed busses (e.g., at 16 Gb/s and above). Thus, simulations may be required to determine compliance of a channel for communication between components (e.g., transmitter (Tx) and receiver (Rx) circuits). For example, time-domain simulations are commonly used to determine channel compliance. As used herein, channel compliance generally refers to a channel which meets one or more design criteria. Design criteria may vary, depending on a particular application. As an example, for channels used to communicate between chip components, design criteria may include achieving a desired bit error rate (BER) for specific Tx and Rx properties (e.g., at a certain bus speed).

In a time-domain simulation, jitter, crosstalk and switching noise properties of a specific Tx (e.g., driver) and Rx combination may be used to evaluate the Tx and Rx equalization on a time-domain data bit pattern propagated through the channel. The result of such a simulation is an eye diagram which provides information on the likelihood of error when passing a "1" or "0" bit through the channel. The properties of the eye diagram may be compared against previously set eye margin requirements to determine if the eye is passing or failing at a specific BER and as a result, determine if the channel is compliant or not. However, determining channel compliance through time domain simulations may require a high level of expertise with a specific time-domain simulation tool that accurately represents the transmitter and receiver. To obtain a low BER millions of bits may be simulated. As a result, this simulation may take a significant amount of time to generate results.

Moreover, these simulations may have to be repeated for many combinations of equalization settings which increases the simulation complexity. Equalization settings generally refer to Tx and Rx properties used to effectively correct a signal such that a Rx component can more effectively distinguish between a "0" or "1" bit. Different equalization settings may work better for different channels. Therefore, a channel may be simulated based on a plurality of equalization settings to determine the channel's compliance.

Thus, simpler and quicker mechanisms to evaluate channel compliance are desirable. Embodiments of the present disclosure provide a method for designing a frequency-domain channel compliance model which may be used to determine a channel's compliance. As presented above, a compliant channel is one that meets a pre-defined set of criteria that ensures the full channel, in operation, achieves specific design criteria (e.g., a bit error rate) for specific Tx and Rx properties (e.g., at a certain bus speed). Once the compliance model has been generated for a given set of Tx and Rx properties, the compliance model may be used to determine compliance of any channel under test for the set of Tx and Rx properties. That is, it is not required to generate a new compliance model each time a channel is tested for compliance for the set of Tx and Rx properties.

In certain embodiments, the channel compliance model may be generated based on frequency-domain parameters which may affect a data bit pattern passing through a channel. These channel frequency domain parameters may include insertion loss, insertion loss deviation, signal to cross talk ratio, and signal to crosstalk ratio deviation.

For example, for given driver and receiver properties, channels stressing the many combinations of frequency domain parameters to different levels may be simulated in the time domain. The results of these simulations provide a set of combinations of frequency-domain parameters representing compliant and noncompliant channels. When a sufficient number of cases are simulated, a multi-dimensional model representing a compliant channel space can be produced. In certain embodiments, a genetic algorithm (GA) may be utilized in order to more efficiently find the bounds of the compliant channel multi-dimensional model.

To determine the bounds of the compliant channel multi-dimensional model, a GA may be provided with a channel template, the physical properties of which the GA may vary (e.g., open area wiring length, pin area wiring length, or impedance of traces). By varying the physical properties of the channel template, the GA is given control to affect the channel's frequency domain parameters. Thus, the GA may create a population of channel variations, each having different combinations of frequency domain parameters. For example, each member of this population may have a different insertion loss among other frequency domain parameters.

Each channel variation of the population may be simulated in the time-domain (e.g., which may include sweeping a plurality of equalization settings) to determine if the channel variation meets a particular objective. In this case, the objective may include finding frequency domain parameters that are on a boundary of compliance with one or more design criteria. For each member of the population, a fitness function may be calculated by the GA and used to determine how close the particular member of the population is to meeting the objective. If the population of channel variations does not meet the objective, the GA may generate another population of channel variations based on the analysis performed on the previous population (e.g., based on the fitness functions generated for the previous population). This iterative process is continued until a sufficient number of boundary sets of frequency domain parameters are found by the GA.

The compliant channel model produced by the GA can be used as an alternative to the time-domain eye simulations to determine the viability of a channel under design. As a result, determining channel compliance can be done quicker with less computing resources, less user expertise, and with less specialized simulation tools as compared to time-domain eye simulations.

Figure 1:
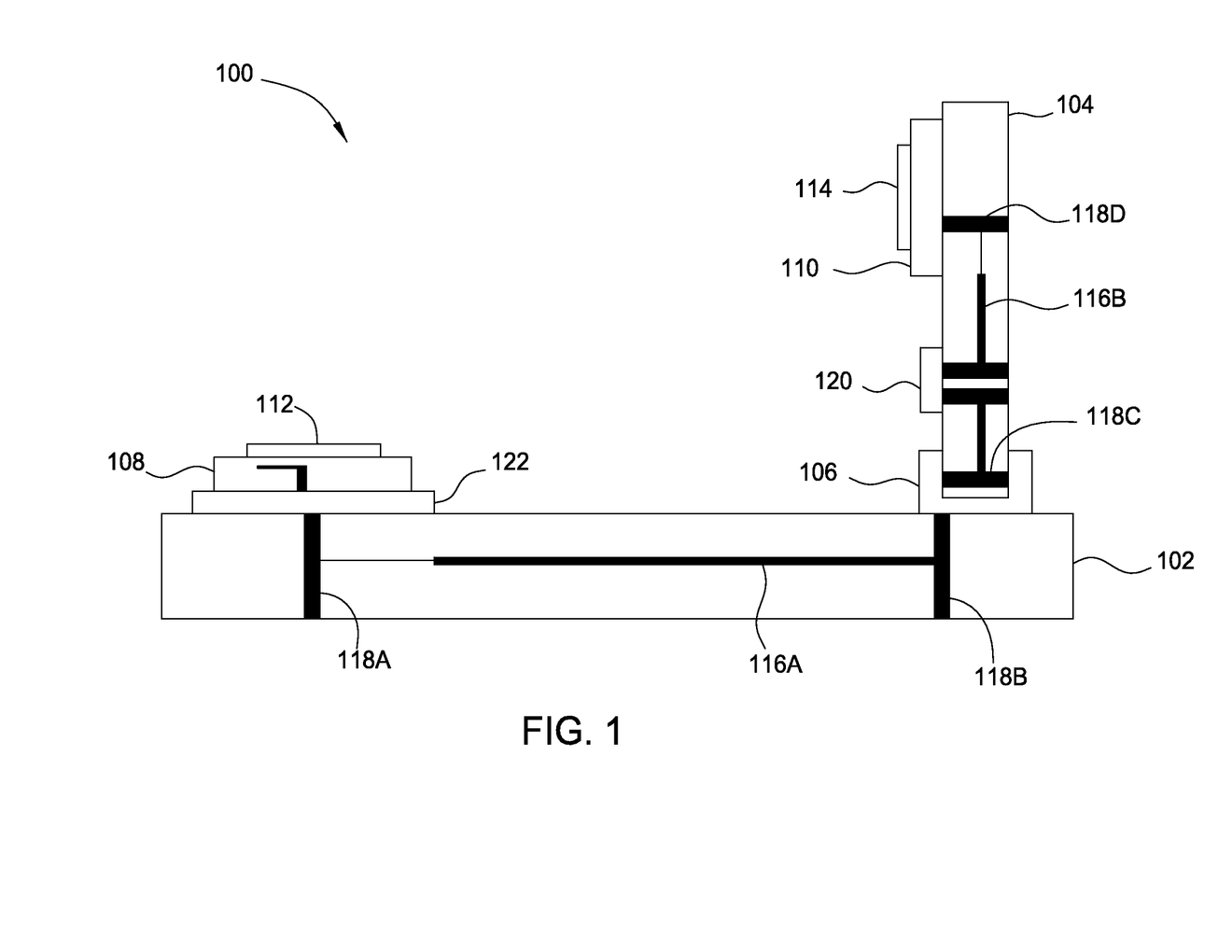
FIG. 1 illustrates an example peripheral component interconnect express (PCIe) third generation (Gen3) channel topology.

FIG. 1 illustrates a typical channel topology 100 (e.g., peripheral component interconnect (PCIe)-Generation three (Gen3)). The channel topology 100 includes two cards, the motherboard 102 and the adapter card 104, connected to each other using a PCIe slot connector 106 (e.g., PCIe surface mount (SMT) connector). These cards contain the end points of the channel such as the root complex 108 connected to a chip 112 (e.g., a processor) on the mother board 102 and the end point device 110 (e.g., end point device package) connected to another chip 114 on the adapter card 104. Many physical properties of this channel topology can contribute towards the degradation or improvement of its signal integrity. For example, the motherboard and adaptor card include wiring (e.g., inner layer wiring 116A and 116B), one or more vias (e.g., vias 118A, 118B, 118C, and 118D), a direct current (DC) blocking capacitor 120, and connectors (e.g., hybrid land grid array (HLGA) connector 122). The loss properties of the dielectric materials used in the mother board 102 or the adaptor card 104 can affect signal attenuation, the spacing and shielding of traces within the different channel components can affect crosstalk noise coupling properties, and the level of impedance matching implemented can cause channel signaling reflections.

A set of frequency domain parameters may be used to represent the channel between two components (e.g., Tx at root complex 108 and Rx at end point device 110). As presented above, once a channel compliance model is designed using the frequency domain parameters, the compliance model may be used to determine compliance of a channel without time-domain analysis, as described with respect to FIG. 2.

Figure 2:
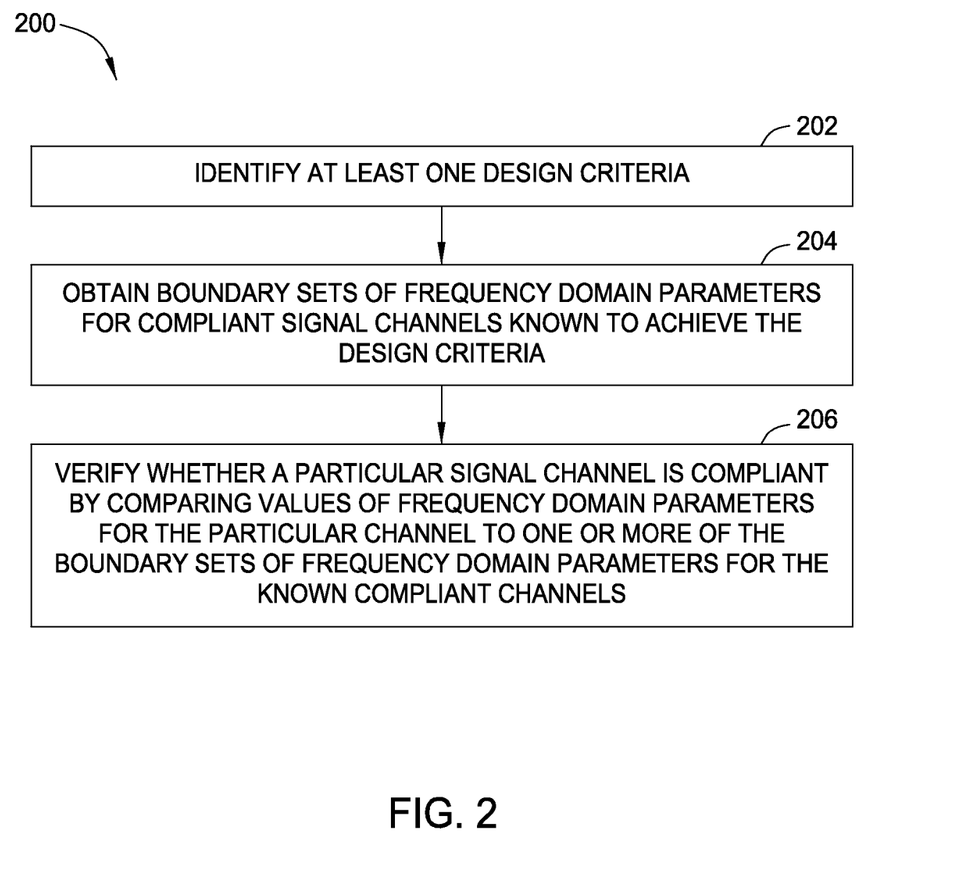
FIG. 2 illustrates example operations for channel compliance testing, in accordance with certain embodiments of the present disclosure.

FIG. 2 illustrates example operations 200 for testing channel compliance, in accordance with certain embodiments of the present disclosure. The operation 200 begin at 202, by identifying at least one design criteria. For example, the design criteria may include a desired bit error rate (BER) for specific Tx and Rx properties. At 204, boundary sets (e.g., a compliance model) of frequency domain parameters for compliant signal channels known to achieve the design criteria may be obtained. For example, the boundary sets may be obtained from a storage device. At 206, a particular signal channel (e.g., a channel under test) may be verified for compliance by comparing values of frequency domain parameters for the particular channel to one or more of the boundary sets of frequency domain parameters for the known compliant channels.

Figure 3:
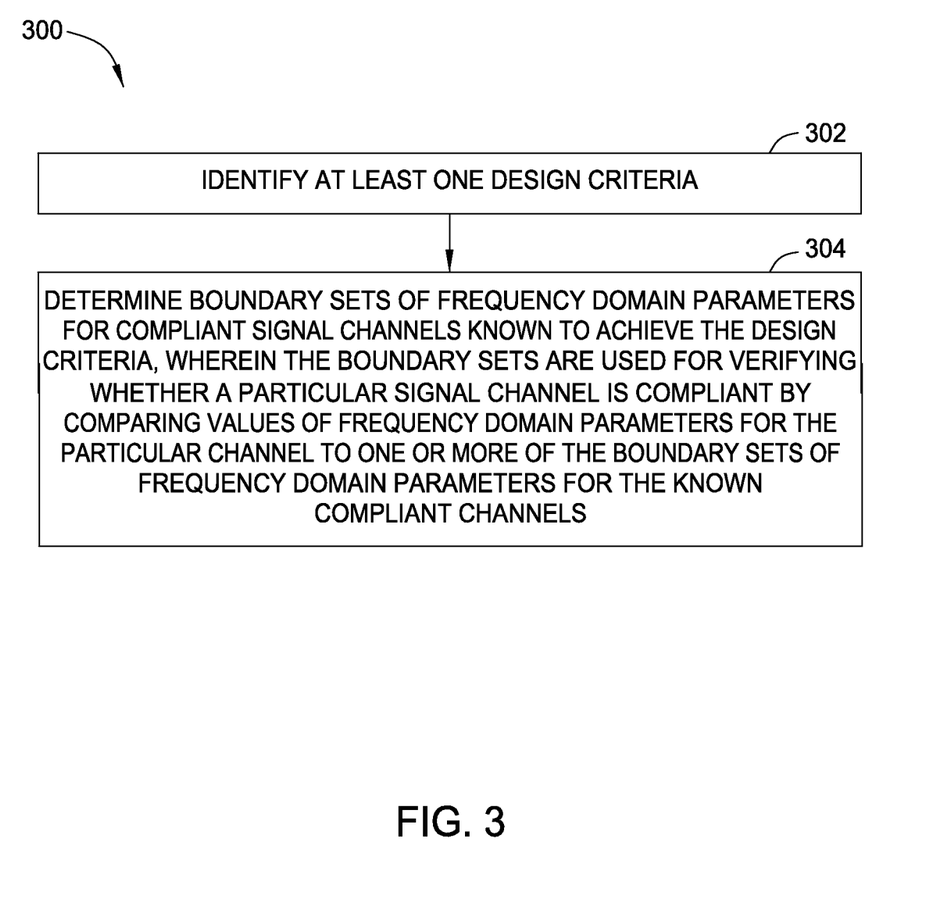
FIG. 3 illustrates example operations for deriving a compliance model, in accordance with certain embodiments of the present disclosure.

FIG. 3 illustrates example operation 300 for deriving the boundary sets, in accordance with certain embodiments of the present disclosure. The operation 300 begin at 302, by identifying at least one design criteria. As presented above, the design criteria may include a desired BER for specific Tx and Rx properties. At 304, boundary sets of frequency domain parameters for compliant signal channels known to achieve the design criteria may be determined. For example, as presented above, the boundary sets may be determined using a GA. The boundary sets are used for verifying whether a particular signal channel is compliant by comparing values of frequency domain parameters for the particular channel to one or more of the boundary sets of frequency domain parameters for the known compliant channels.

The process of deriving the boundary sets based on frequency domain parameters is described in more detail with respect to FIGS. 4-9. The channel frequency domain parameters which may be used to design the compliance model may include at least one of channel insertion loss at bus fundamental frequency (ILF), channel insertion loss deviation (ILD) measure, channel maximum insertion loss deviation below and above bus fundamental frequency (ILDB/ILDA), channel signal to crosstalk ratio at bus fundamental frequency (SXTF), channel minimum insertion loss deviation below and above bus fundamental frequency (SXTB/SXTA). Values for the frequency domain parameters may be determined based on S-parameters indicative of a frequency response of the particular channel.

Figure 4:
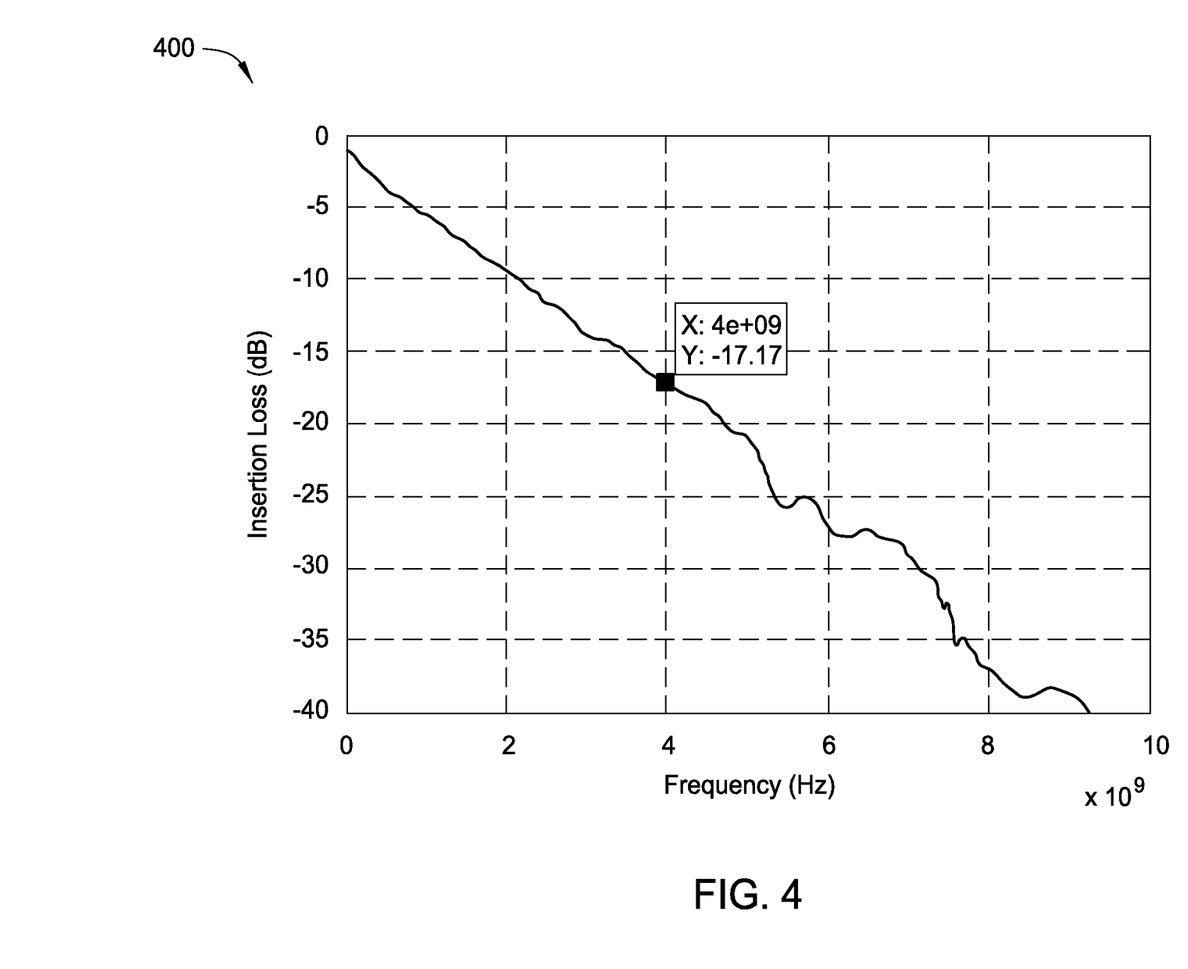
FIG. 4 illustrate an example graph of channel differential insertion loss of a communication bus in decibels (dB).

In certain embodiments, the channel ILF parameter may be calculated at a fundamental frequency of a bus (e.g., a typical PCIe-Gen3 bus (e.g., 4 GHz) in dB). This parameter generally describes the attenuation of a signal travelling through the channel. Its value may be affected in large part by dielectric material loss properties, signal propagation distance and channel impedance matching properties. FIG. 4 illustrates a graph 400 of the insertion loss in dB as a function of frequency. As illustrated, ILF is measured at the fundamental frequency of the bus (e.g. at 4 GHz).

Channel ILD measure may be used to quantify the amount of reflections within a channel among other things. In order to quantify ILD, a fit of the insertion loss curve is generated between 0 Hz and a high frequency point defined at which the insertion loss is 40 dB or the highest frequency in the S-parameter model, whichever comes first. The curve fitting of the insertion loss may be done by moving average smoothing. The moving average smoothing procedure may use a window size of 51 discrete frequency points centered at the point under consideration. This window may span a 1.02 GHz range with a 20 MHz step S-parameter model. While the window size of 51 is provided as an example to facilitate understanding, different window sizes may be considered if, for example, a different S-parameter frequency resolution is used.

Figure 5:
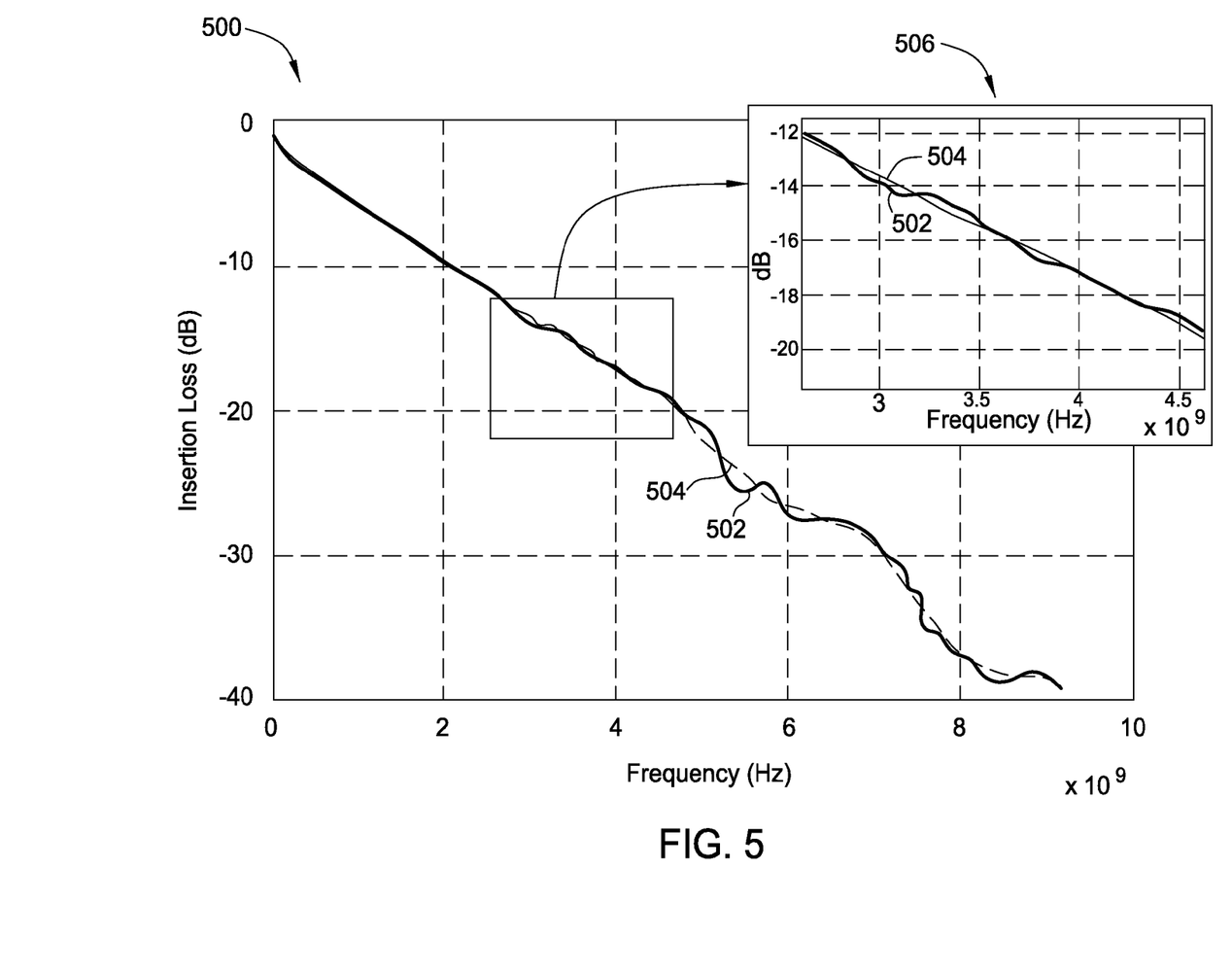
FIG. 5 illustrates an example graph of channel differential insertion loss and a corresponding fitted curve.

FIG. 5 is a graph 500 of an example insertion loss curve 502 along with a corresponding fitted curve 504 (e.g., moving average smoothing). Once the fitted line is obtained, the error between the original insertion loss curve and the fitted curve may be found at each discrete frequency point in the S-parameter model. The square of each discrete frequency point error may then be found after which the sum of all squares may be calculated and divided by the total number of discrete frequency points considered. The resulting value is the insertion loss deviation measure. Graph 506 is a zoomed in view of graph 500 which more clearly demonstration the insertion loss curve 502 and fitted curve 504.

In addition to the ILD measure, ILDB and ILDA parameters are found by finding the maximum difference between the insertion loss curve and its fitted curve. ILDB and ILDA may be used because the ILD measure may not take into account where a deviation happens with respect to frequency. Ripples in the insertion loss at lower frequencies may have a greater effect on the channel signaling than at higher frequencies. This may be due to the fact that a channel may have higher transmission amplitudes at the lower frequency. By considering the ILDB and ILDA parameters, worst case frequency dependence may be covered.

The SXTF parameter may be found in order to get a measure of the amount crosstalk noise on a victim net in the channel under consideration at the fundamental frequency. This value may be calculated by finding the difference between the insertion loss and the crosstalk aggression power sum at the fundamental frequency of the bus (e.g., 4 GHz). The crosstalk power sum from all the crosstalk aggressors may be calculated using root sum square (RSS).

Figure 6:
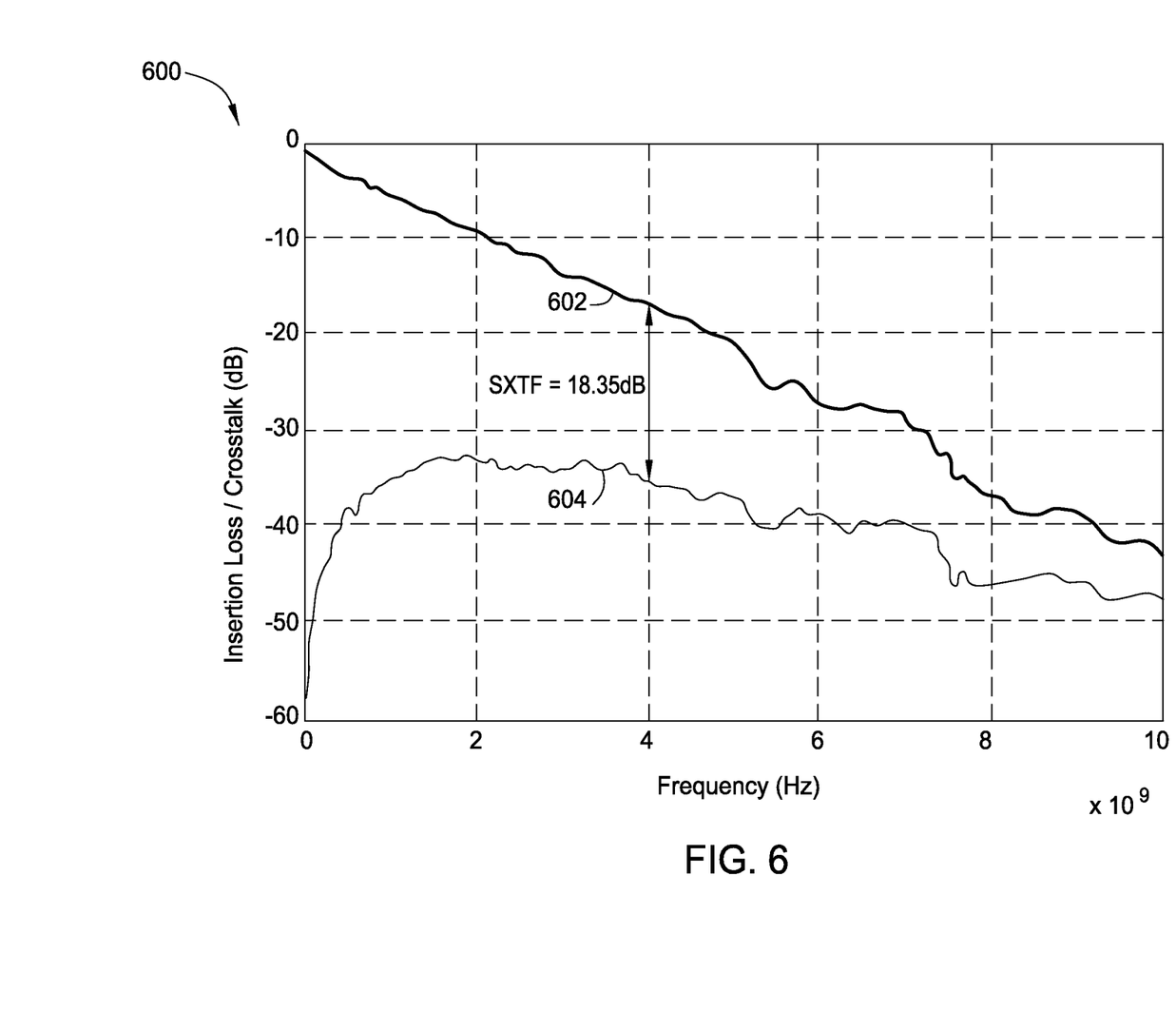
FIG. 6 illustrates an example graph for deriving channel signal to crosstalk ratio.

FIG. 6 is a graph 600 that shows an example signal to crosstalk ratio measure at a fundamental frequency of a bus, in accordance with certain embodiments of the present disclosure. The graph illustrates the insertion loss 602 and the cross talk aggression power sum 604 in dB as a function of frequency. The SXTF may be calculated by measuring the difference between the insertion loss 602 and the cross talk aggression power sum 604 at a fundamental frequency (e.g., 4 GHz), which is 18.35 dB in this case.

For SXTB and SXTA parameters, two signal to crosstalk ratio measures are considered that are motivated by the fact that crosstalk aggression at fundamental frequency may not be able to solely represent the effect of crosstalk on a channel's signaling. The full frequency band of the channel may be considered. These two measures are the minimum signal to crosstalk ratio between 0 Hz and bus fundamental frequency and the minimum signal to crosstalk ratio between fundamental and the high frequency point. The high frequency point may be the frequency at which the insertion loss is 40 dB or the highest frequency in the S-parameter model, which ever point comes first. All discrete frequency points within these frequency ranges may be considered.

In generating the compliance model, channels stressing different combinations of the frequency domain parameters described above may be simulated in the time domain given specific driver (or transmitter) and receiver properties. For example, the driver properties may include slew rate, driver signal level, random jitter, sinusoidal jitter, duty cycle distortion, number of feed-forward equalization (FFE) taps, resolution of FFE taps, and the number of FFE precursors. Receiver simulation properties may include random jitter, sinusoidal jitter, automatic gain control (AGC), maximum AGC gain, target level for AGC gain, minimum AGC gain, minimum latch overdrive, AGC gain Gaussian amplitude noise range, number of decision feedback equalization (DFE) taps, and continuous time linear equalization (CTLE).

The goal of these simulations is to find sets of frequency domain parameter combinations defining the boundaries of a multi-dimensional compliance model. To avoid brute force simulations, genetic algorithm (GA) optimization may be used in order to intelligently find boundary sets of the frequency domain compliance model, as described above. Each set of frequency domain parameters is representative of a boundary compliant channel.

Figure 7:
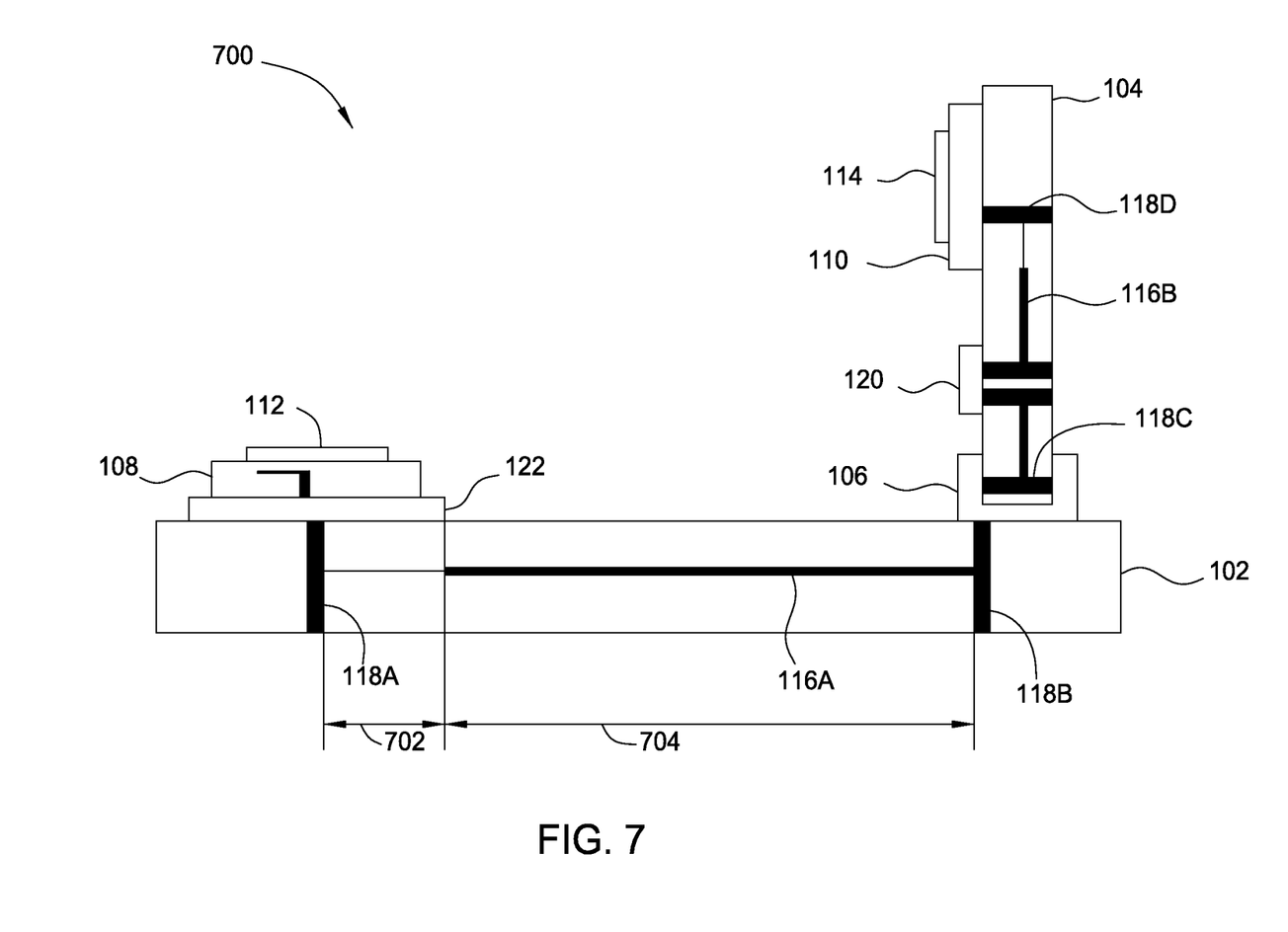
FIG. 7 illustrates an example channel template used by a genetic algorithm to generate a compliance model, in accordance with certain embodiments of the present disclosure.

As presented above, in order to provide the GA with sufficient variations to produce rich populations of boundary sets, an example channel template may be used to represent a channel topology for which a compliance model is to be generated. FIG. 7 is an example channel template representative of a typical PCIe-Gen3 bus, which is a differentially wired bus, and includes models for the different components shown in FIG. 7 and described above with respect to FIG. 1. The components include up to eight crosstalk differential aggressors (up to 8 aggressors). Certain channel characteristics were varied resulting in different sets of frequency domain parameters.

Different channel characteristics may be varied by the GA, which include the length of the pin area wiring 702 and the open area wiring length 704 and impedance. All other sections of the channel may be left unchanged for the all the channel variations exercised by the GA. In certain embodiments, the pin area wiring length 702 may be varied in 1.1 inch segments between 1.1 inches and 8.8 inches total. In addition to being a source of signal attenuation, the pin area wiring length may be a source of crosstalk because of the nature of the routing environment which does not allow designers to escape wiring while having enough separation between differential pairs or clearance from anti-pads to control crosstalk noise coupling within a layer and between layers. The coupling between layers may be increased due to the functional misregistration which may be included in the pin area wiring models.

In certain embodiments, the open area wiring length 704 may be varied in 2 inch segments between 2 inches and 12 inches total, for example. Each segment could be selected to have a differential impedance between 70 Ohms and 100 Ohms in steps of 5 Ohms. The open area length 704 may have minimal crosstalk contribution on the channel because the pairs may be sufficiently spaced from each other. The different options available for the open area wiring could affect signal attenuation and cause channel internal reflections which results in increased insertion loss deviation. Of course, in good design practice a constant open area differential wiring 85 Ohm impedance would be maintained within the manufacturing process capability. To find the frequency domain compliance multidimensional model the impedance variation in the open area wiring is stressed to bound the insertion loss deviation.

Given Tx (e.g., driver) and Rx input/output (I/O) circuit properties, example GA optimization steps which may be used to generate the compliance model are as follows. First, channel variations (e.g., 100 channel variations) may be created using combinations of the channel characteristics. For example, this may be performed at random at the beginning of the first optimization iteration and through the GA's crossover and mutation operations in following iterations. Each channel variation may be simulated in the time domain by sweeping a plurality of equalization settings (e.g., sweeping 80 equalization setting including FFE and CTLE combinations). The eye results as a result of equalization setting sweep for each channel variation may then be processed and the fitness measure for each channel variation may be evaluated. A channel satisfies a fitness criteria (e.g., has frequency domain parameters that fall on a boundary of channel compliance) if the channel has only two equalization settings (of the total 80 swept, for example) that result in passing vertical and horizontal eye margins. Minimum passing vertical and horizontal eye margins may be 60 mVpp and 15% unit interval (UI) at a BER of $10^{-12}$ respectively (e.g., for a custom PCIe-Gen3 bus).

If a certain channel variation is found to satisfy the fitness function, the channel variation characteristics may be saved. All considered channel variations may be removed from pool of consideration for the following iterations. Then, the algorithm continues to the next iteration generating a new population based on what was learned from the previous iteration of the algorithm.

If no channel variation was found to satisfy the fitness function, the algorithm continues to the next iteration generating a new population based on what was learned from the previous iteration. All considered channel variations are removed from pool of consideration for the following iterations. The genetic algorithm continues to run until a sufficient number of channel variations satisfying the fitness criteria are found in order to sufficiently describe the boundaries of the frequency domain compliance model.

Figure 8:
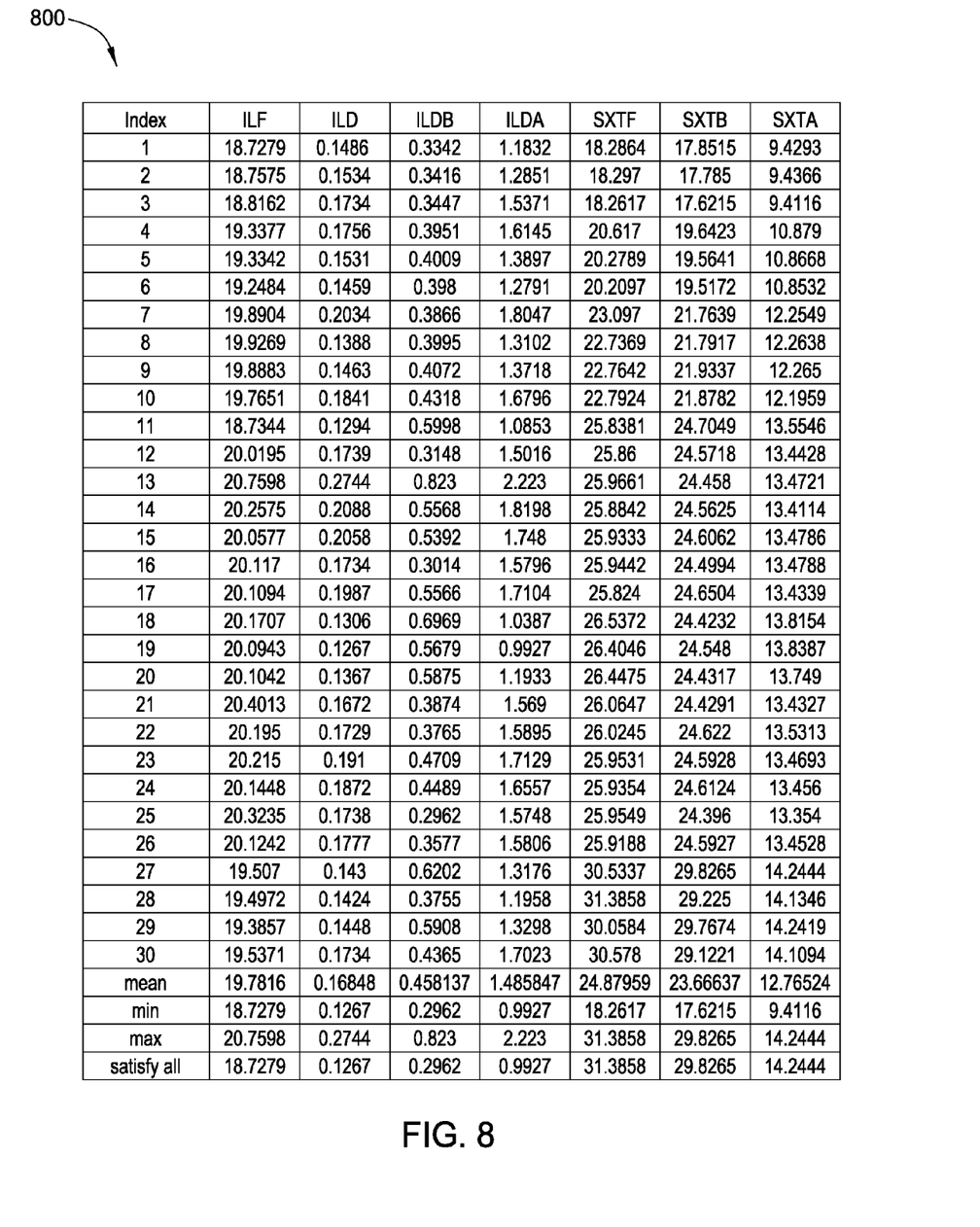
FIG. 8 illustrates a table of example frequency domain compliance model boundary sets, in accordance with certain embodiments of the present disclosure.

FIG. 8 is a table 800 showing a plurality of example frequency domain parameters representing instances lying on the boundary of the multidimensional frequency domain compliance model obtained as a result of the operations described above. Each set describes a single boundary compliant channel. In certain embodiments, given a channel to be tested for compliance, if at least a single boundary parameter set (e.g., boundary parameters of index 28) presented in FIG. 8 is found to be worse than the channel under test, then the channel is rendered compliant. As illustrated, each boundary parameter set is represented by an index number. A worse boundary parameter set would have larger ILF, ILD, ILDB and ILDA but smaller SXTF, SXTB and SXTA. The more frequency domain sets found by the GA, the more covering the frequency domain compliance model is.

The "satisfy all" row in the Table V represents a single frequency domain parameter set obtained by going through all 30 boundary sets and using the best of each of the seven frequency domain parameters. A test channel better than the "satisfy all" row would be identified as a compliant channel. However, as can be expected using the "satisfy all" row as a lone frequency domain parameter set to check for compliance would result in a very restrictive compliance model. This is because certain frequency domain parameters in a given channel may be stressed if other frequency domain parameters have better values (for example an increased loss in a certain channel may still render a channel compliant if it had a large Signal to Crosstalk ratio). Therefore, a channel that meets the requirements of any of the index rows may be considered as a compliant channel.

Figure 9:
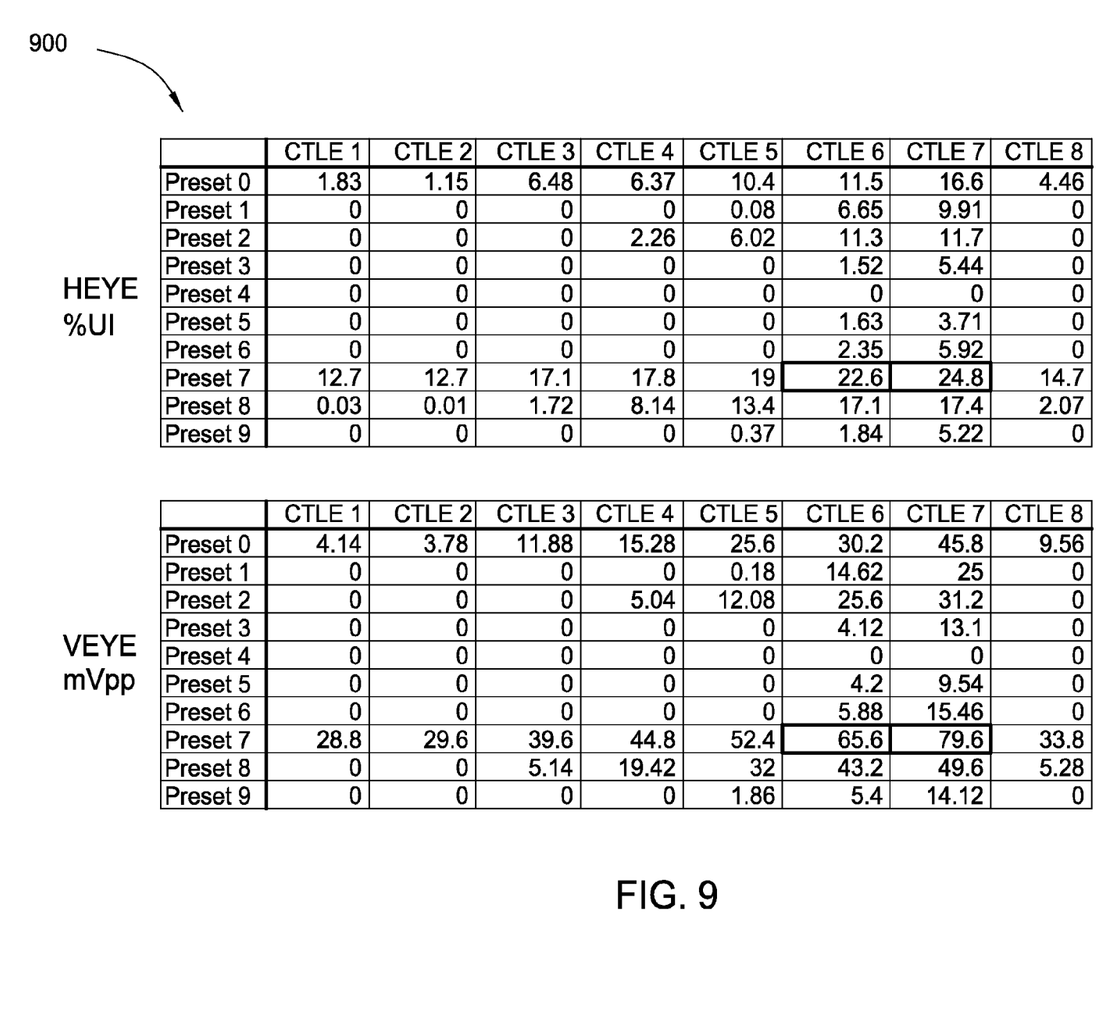
FIG. 9 illustrates eye opening margins for a boundary set of the compliance model of FIG. 8, in accordance with certain embodiments of the present disclosure.

FIG. 9 is a table 900 illustrating the eye opening margins at $10^{-12}$ BER for the parameter set index 28 shown in the table of FIG. 8 after running time domain simulations using the same Tx and Rx properties used to generate the table of FIG. 8. As presented above, the required vertical eye (VEYE) and horizontal eye (HEYE) margins for an example custom PCIe-Gen3 bus may be 60 mVpp and 15% UI at a BER of $10^{-12}$ respectively. As illustrated, frequency domain parameter set 28 has only two passing eye margins as a result of sweeping all the 80 FFE-CTLE equalization setting combinations (e.g., at preset 7 representing a type of equalization setting and CTLE 6 and 7 for the horizontal and vertical eye margins). This indicates that the frequency domain parameter values of index 28 fall on a boundary of acceptable parameters for a compliant channel, based on a design criteria of $10^{-12}$ BER given the assumed Tx and Rx circuit properties to generate the compliance model. Thus, the eye opening margins illustrated in FIG. 9 illustrate that the boundary parameters at parameter set index 28 satisfy the fitness criteria used by the GA for defining a boundary case.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, embodiments of the present disclosure may be embodied as a system, method or computer program product. Accordingly, embodiments of the present disclosure may take the form of an entirely hardware embodiment, an entirely software embodiment (including firmware, resident software, microcode, etc.) or an embodiment combining software and hardware embodiments that may all generally be referred to herein as a "circuit," "module" or "system." Furthermore, embodiments of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The present disclosure may be a system, a method, and/or a computer program product. The computer program product may include a computer readable storage medium (or media) having computer readable program instructions thereon for causing a processor to carry out embodiments of the present disclosure.

The computer storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present disclosure.

Embodiments of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement embodiments of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A computer program product for channel compliance testing, the computer program product comprising a non-transitory computer readable storage medium having program instructions embodied therewith, the program instructions executable by a processor to cause the processor to,
   identify at least one design criteria;
   obtain boundary sets of frequency domain parameters for compliant signal channels known to achieve the design criteria; and
   verify whether a particular signal channel is compliant by comparing values of frequency domain parameters for the particular channel to one or more of the boundary sets of frequency domain parameters for the known compliant channels, wherein the signal channel is part of communication bus and the boundary sets of frequency domain parameters comprise at least one parameter related to insertion loss and at least one parameter related to a crosstalk ratio at a fundamental frequency of the bus.

2. The computer program product of claim 1, wherein the program instructions are executable by the processor to further cause the processor to derive the frequency domain parameters for the particular channel from S-parameters indicative of a frequency response of the particular channel.

3. The computer program product of claim 1, wherein the design criteria comprises a desired bit error rate for a particular set of bus transmitter and receiver properties.

4. The computer program product of claim 1, wherein the program instructions are executable by the processor to further cause the processor to determine the boundary sets using a genetic.

5. The computer program product of claim 1, wherein the particular signal channel is used for communication between a first and second components and the boundary sets are determined for at least one known property of the first and second components.

6. The computer program product of claim 1, wherein the verifying comprises:
   determining whether the particular signal channel is compliant based on a comparison of the frequency domain parameters for the particular channel to frequency domain parameters of a first boundary set; and
   if not, determining whether the particular signal channel is compliant based on a comparison of the frequency domain parameters for the particular channel to frequency domain parameters of a second boundary set.

7. A processing system, comprising:
   at least one processor configured to:
      identify at least one design criteria;
      obtain boundary sets of frequency domain parameters for compliant signal channels known to achieve the design criteria; and
      verify whether a particular signal channel is compliant by comparing values of frequency domain parameters for the particular channel to one or more of the boundary sets of frequency domain parameters for the known compliant channels, wherein the signal channel is part of a communication bus and the boundary sets of frequency domain parameters comprise at least one parameter related to insertion loss and at least one parameter related to a crosstalk ratio at a fundamental frequency of the bus; and
   a memory coupled to the at least one processor.

8. The processing system of claim 7, wherein the processor is configured to derive the frequency domain parameters for the particular channel from S-parameters indicative of a frequency response of the particular channel.

9. The processing system of claim 7, wherein the design criteria comprises a desired bit error rate for a particular set of bus transmitter and receiver properties.

10. The processing system of claim 7, wherein the processor is configured to determine the boundary sets using a genetic algorithm.

11. The processing system of claim 7, wherein the particular signal channel is used for communication between a first and second components and the boundary sets are determined for at least one known property of the first and second components.

* * * * *